US012257641B2

(12) United States Patent
Aida et al.

(10) Patent No.: US 12,257,641 B2
(45) Date of Patent: Mar. 25, 2025

(54) WORK PROCESSING APPARATUS

(71) Applicants: National University Corporation Nagaoka University of Technology, Niigata (JP); Fujikoshi Machinery Corp., Nagano (JP); Toshiro Doi, Fukuoka (JP)

(72) Inventors: Hideo Aida, Niigata (JP); Hidetoshi Takeda, Niigata (JP); Toshiro Doi, Fukuoka (JP); Tadakazu Miyashita, Nagano (JP); Atsushi Kajikura, Nagano (JP)

(73) Assignees: Toshiro DOI, Fukuoka (JP); National University Corporation Nagaoka University of Technology, Niigata (JP); Fujikoshi Machinery Corp., Nagano (JP)

( * ) Notice: Subject to any disclaimer, the term of this patent is extended or adjusted under 35 U.S.C. 154(b) by 382 days.

(21) Appl. No.: 17/696,361

(22) Filed: Mar. 16, 2022

(65) Prior Publication Data

US 2022/0297223 A1 Sep. 22, 2022

(30) Foreign Application Priority Data

Mar. 18, 2021 (JP) ................................. 2021-044350
Dec. 16, 2021 (JP) ................................. 2021-204585

(51) Int. Cl.
*B23K 10/00* (2006.01)
*H01J 37/32* (2006.01)

(52) U.S. Cl.
CPC ...... *B23K 10/003* (2013.01); *H01J 37/32541* (2013.01)

(58) Field of Classification Search
CPC ............ H01J 37/32541; H01J 37/32568; H01J 37/32596; B23K 10/003
(Continued)

(56) References Cited

U.S. PATENT DOCUMENTS 5,543,688 A * 8/1996 Morita .............. H01J 37/32082
 315/111.21
2003/0201067 A1* 10/2003 Boyd ..................... B24B 47/22
 156/345.1

(Continued)

FOREIGN PATENT DOCUMENTS

JP 2015-159257 9/2015
JP 2015-179830 10/2015

*Primary Examiner* — Charlee J. C. Bennett

(74) *Attorney, Agent, or Firm* — Stephen J. Weyer, Esq.; Stites & Harbison, PLLC

(57) ABSTRACT

A work processing apparatus performs processing of a surface to be processed of a work by causing a processing head to come into sliding contact with the work held on an upper surface of a holding plate. The processing head includes a plasma electrode that generates plasma and radiates the plasma to the surface to be processed of the work. In the plasma electrode, an annular or solid cylindrical central electrode provided at a center in a radial direction and an annular outer circumferential electrode provided at an outer side in the radial direction with respect to the central electrode are arranged with an annular slit portion intermediating therebetween at a boundary position thereof, the slit portion is configured as a plasma generation space, and a processing pad is provided at bottom surfaces of the central electrode and the outer circumferential electrode.

6 Claims, 11 Drawing Sheets

(58) Field of Classification Search
USPC .................................. 156/345.12, 345.41
See application file for complete search history.

(56) References Cited

U.S. PATENT DOCUMENTS

| | | | |
|---|---|---|---|
| 2005/0208876 A1* | 9/2005 | Chen .................... | B24B 49/00 |
| | | | 451/5 |
| 2005/0217798 A1* | 10/2005 | Sugiyama ......... | H01J 37/32009 |
| | | | 156/345.31 |
| 2010/0147463 A1* | 6/2010 | Yamauchi ............. | C23C 18/145 |
| | | | 156/345.12 |
| 2011/0006040 A1* | 1/2011 | Savas .................... | C23C 16/407 |
| | | | 427/579 |
| 2011/0212624 A1* | 9/2011 | Hudson ............. | H01J 37/32596 |
| | | | 156/345.29 |
| 2017/0178869 A1* | 6/2017 | Chambers ............... | H01J 37/08 |
| 2017/0338083 A1* | 11/2017 | Chambers ............. | C03C 17/245 |

* cited by examiner

PORTION XIV

SAMPLE (1)

SAMPLE (2)

SAMPLE (3)

SAMPLE (4)

SAMPLE (5)

WORK PROCESSING APPARATUS

CROSS-REFERENCE TO RELATED APPLICATION

This application is based upon and claims the benefit of priority of the prior Japanese Patent Applications Nos. 2021-044350, filed on Mar. 18, 2021 and 2021-204585, filed on Dec. 16, 2021 and the entire contents of which are incorporated herein by reference.

TECHNICAL FIELD

The present invention relates to a work processing apparatus and, more particularly, to a work processing apparatus which processes the surface of a work by causing a processing head to come into sliding contact with the work being held by a holding plate.

BACKGROUND ART

With respect to a substrate (work), such as a wafer, in manufacturing semiconductor power devices, processing (treatment) of the surface thereof is essential. Particularly, since a wideband gap semiconductor substrate typified by silicon carbide (SiC), gallium nitride (GaN), or diamond is hard and brittle, there is an issue in which such a substrate is difficult to high-efficiently process by conventional mechanical processing. Furthermore, the term "processing" as used in the present application is assumed to widely include processing for performing stripping of a surface, such as grinding for grinding a surface, polishing for reducing a surface roughness degree, and planarization for increasing a flatness.

In processing the above-mentioned substrate, using a processing method called plasma chemical vaporization machining (P-CVM) is conceivable. This method is a chemical processing method using plasma under the environment of atmospheric pressure, and enables high-efficient processing owing to its high radical density. However, that method is a processing method which performs isotropic etching and processes not only a raised portion of the surface but also a recessed portion of the surface and, therefore, may be unsuitable for the purpose of planarization.

Therefore, in, for example, PTL 1 (JP-A-2015-159257) and PTL 2 (JP-A-2015-179830), there are disclosed a method and an apparatus each of which performs, with a high degree of accuracy and a high degree of efficiency, processing on a processing resistant material, such as silicon carbide (SiC), gallium nitride (GaN), or diamond, with use of plasma treatment and mechanical processing in combination.

SUMMARY OF INVENTION

Technical Problem

However, since a conventional work processing apparatus disclosed in PTL 1 as an example has a configuration in which a mechanical section which performs chemical mechanical polishing (CMP) and a mechanical section which performs plasma treatment are arranged independently of each other and processing of a work is alternately repeated by the respective mechanical sections, there is an issue in which the takt time may become long and the production efficiency may decrease.

On the other hand, since a conventional work processing apparatus disclosed in PTL 2 as an example has a configuration in which a mechanical section which performs plasma treatment is incorporated in a surface plate, there is an issue in which, for example, fixation of slurry may occur at such a place of incorporation or plasma generation may become unstable due to the influence of slurry (wet environment).

Solution to Problem

In response to the above issues, one or more aspects of the present invention are directed to providing a work processing apparatus capable of implementing a high processing rate and stably performing processing in a short amount of time with respect to a work formed with use of a processing resistant material.

In view of the above, the following embodiments are described below.

A work processing apparatus according to the present invention is configured to perform processing of a surface to be processed of a work by causing a processing head to come into sliding contact with the work held on an upper surface of a holding plate, wherein the processing head is provided to be rotatable and includes a plasma electrode configured to generate plasma and radiate the plasma to the surface to be processed of the work, and wherein, in the plasma electrode, an annular or solid cylindrical central electrode provided at a center in a radial direction and an annular outer circumferential electrode provided at an outer side in the radial direction with respect to the central electrode are arranged with an annular slit portion intermediating therebetween at a boundary position thereof, the slit portion is configured as a plasma generation space, and a processing pad is provided at bottom surfaces of the central electrode and the outer circumferential electrode.

Advantageous Effects of Invention

According to aspects of the present invention, the work processing apparatus is able to perform processing while performing reformulation or etching of a surface to be processed even with respect to a work formed with use of a processing resistant material, thus enabling increasing a processing rate. Moreover, the work processing apparatus is able to perform a plasma treatment process and a processing process concurrently, i.e., without making a change of position of the work between mechanisms, by successive processing and, therefore, perform processing in a short amount of time, thus enabling improving a production efficiency.

DESCRIPTION OF EMBODIMENTS

First Embodiment

Figure 1:
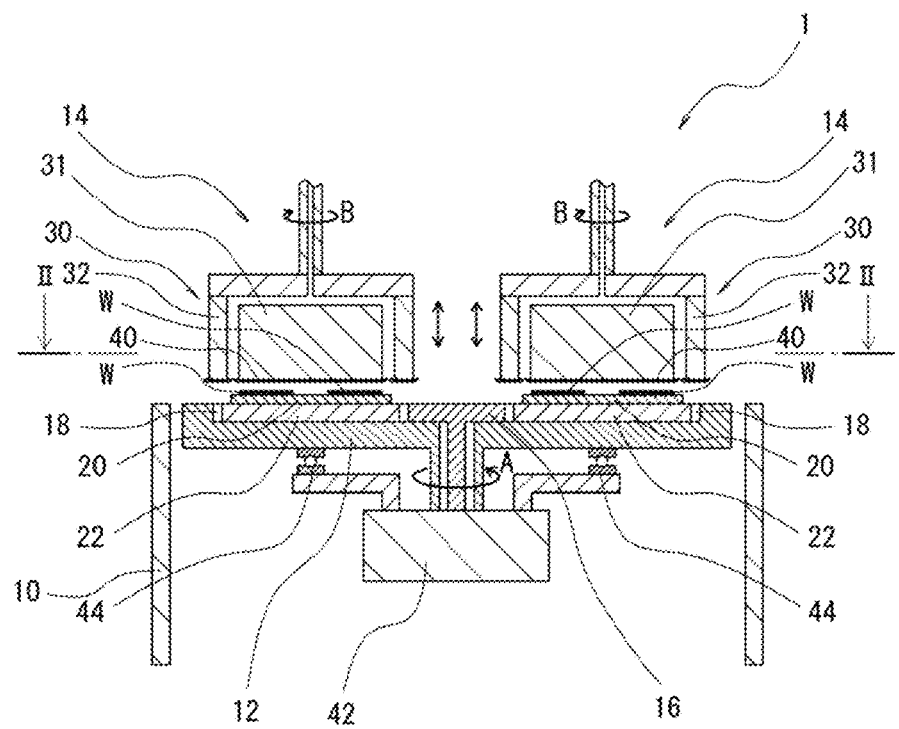
FIG. 1 is a front sectional view illustrating an example of a work processing apparatus according to a first embodiment of the present invention.
Figure 2:
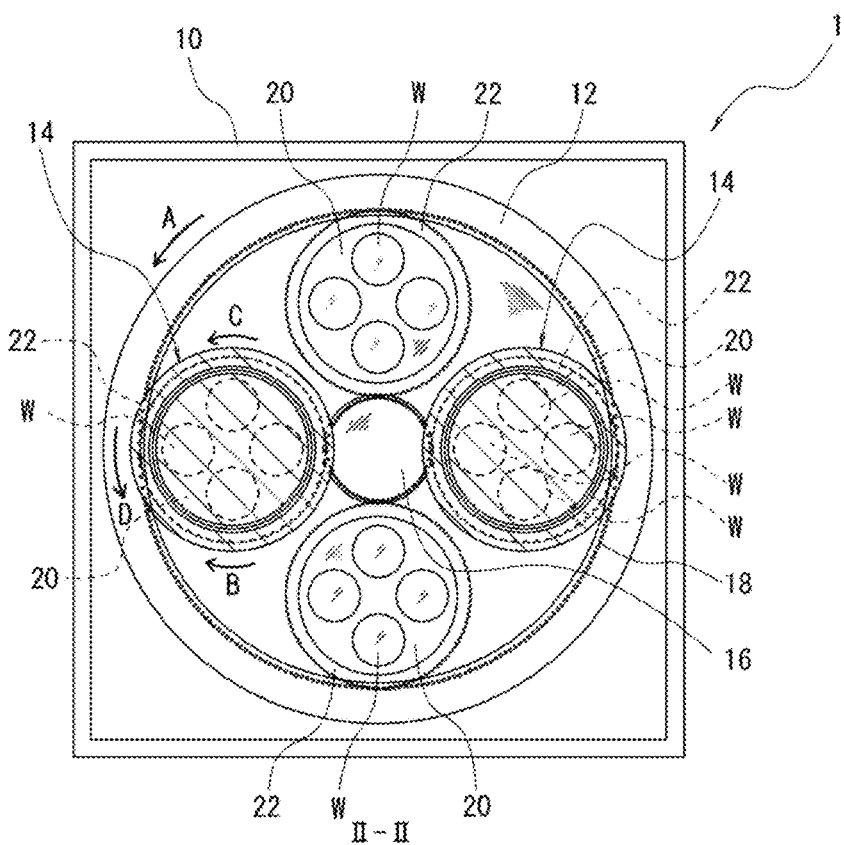
FIG. 2 is a sectional view taken along line II-II in FIG. 1.
Figure 3:
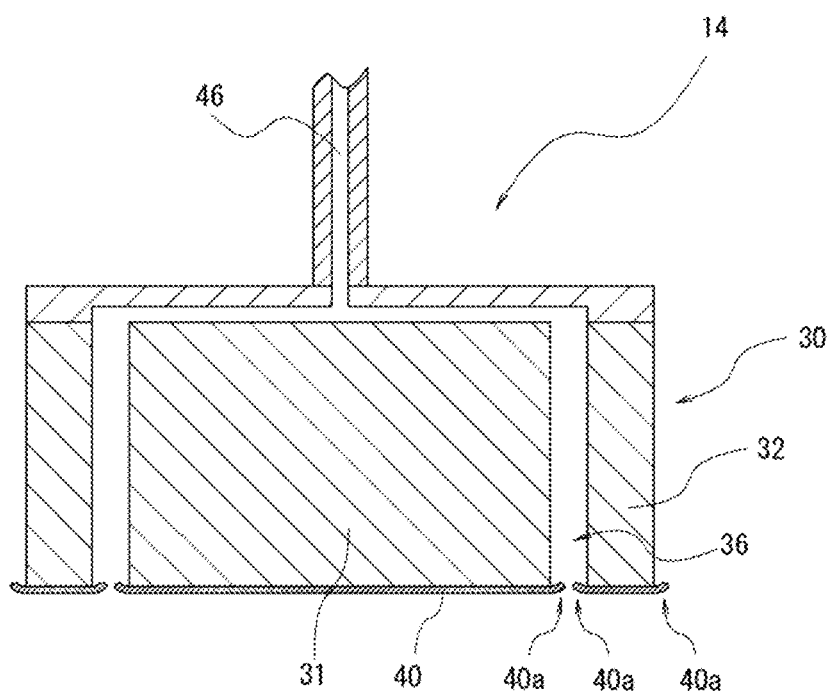
FIG. 3 is an enlarged view of a processing head in the work processing apparatus illustrated in FIG. 1.

A first embodiment of the present invention is described in detail below with reference to the drawings. FIG. 1 is a front sectional view (schematic view) illustrating an example of a work processing apparatus 1 according to the present embodiment. Moreover, FIG. 2 is a sectional view (schematic view) taken along line II-II in FIG. 1. Moreover, FIG. 3 is an enlarged view (schematic view) of a processing head 14 in the work processing apparatus 1 illustrated in FIG. 1. Furthermore, in all of the figures for use in describing the following embodiments, members having the respective same functions are assigned the respective same reference characters and any repetitive description thereof may be omitted.

The work processing apparatus 1 according to the present embodiment is an apparatus which performs processing (surface treatment) by causing the processing head 14 to come into sliding contact with a work W placed on a holding plate 20 fixed to the upper surface of a turntable 12 while pressing the processing head 14 against the work W.

On the other hand, the work W targeted for processing is, for example, a substrate (as an example, a disk-shaped wafer) formed with use of what is called a processing resistant material, which is typified by, for example, silicon carbide (SiC), gallium nitride (GaN), or diamond, and the outer diameter and thickness thereof are not specifically limited (as an example, the outer diameter being about several centimeters (cm) to several tens of cm and the thickness being about several micrometers (μm) to several millimeters (mm)).

Moreover, the holding plate 20 according to the present embodiment functions to allow one or a plurality of works W to be held (pasted) on a holding surface (upper surface) thereof and cause a surface to be processed (upper surface) of the work W to come into abutting contact with a work processing surface (lower surface) of the processing head 14. While, in the present embodiment, the lower surface of the work W is attached and pasted to the holding surface (upper surface) of the holding plate 20 with a known peel-off adhesive, the present embodiment is not limited to this, and any other method such as fitting-in using vacuum suction or recess formation can also be used. Furthermore, the holding plate 20 is required to be a material which is high in flatness accuracy and is not deformable, and is usually formed with, for example, glass or ceramic.

Next, the turntable 12 according to the present embodiment is formed into a circular shape in planar view with use of a metallic material (as an example, a stainless alloy), and is configured to be supported by a bearing 44 and rotationally driven (in the direction of arrow A) by a drive device (as an example, a drive mechanism equipped with an electric motor) 42. Furthermore, the holding plate 20 is held (fixed) at a predetermined position on the turntable 12 via a carrier 22. Usually, the carrier 22 is formed with a metallic material (as an example, a stainless alloy).

Here, the carrier 22 is meshed with a sun gear 16 and an internal gear 18, which are arranged coaxially with the central axis of the turntable 12, while being put between the sun gear 16 and the internal gear 18, and is rotationally driven by the rotation of the turntable 12 in such a way as to both rotate (in the direction of arrow C) and revolve (in the direction of arrow D). These rotation and revolution of the carrier 22 cause the holding plate 20 to both rotate (in the direction of arrow C) and revolve (in the direction of arrow D). Furthermore, while, in the present embodiment, a configuration in which four carriers 22 are arranged between the sun gear 16 and the internal gear 18 is employed, the present embodiment is not limited to this configuration.

Next, the processing head 14 according to the present embodiment is supported in such a way as to be movable up and down at a position above the turntable 12, and is configured to be rotatable (in the direction of arrow B) by a drive device (not illustrated) including, for example, an electric motor mounted at a supporting frame 10. As an example, the processing head 14 is configured with a known mechanism including, for example, a spline. Moreover, the lower surface of the processing head 14 is configured as a work processing surface used for performing processing of the work W, and is further configured to be equipped with a plasma electrode 30, which generates plasma and radiates the plasma to a surface to be processed of the work W.

Figure 4:
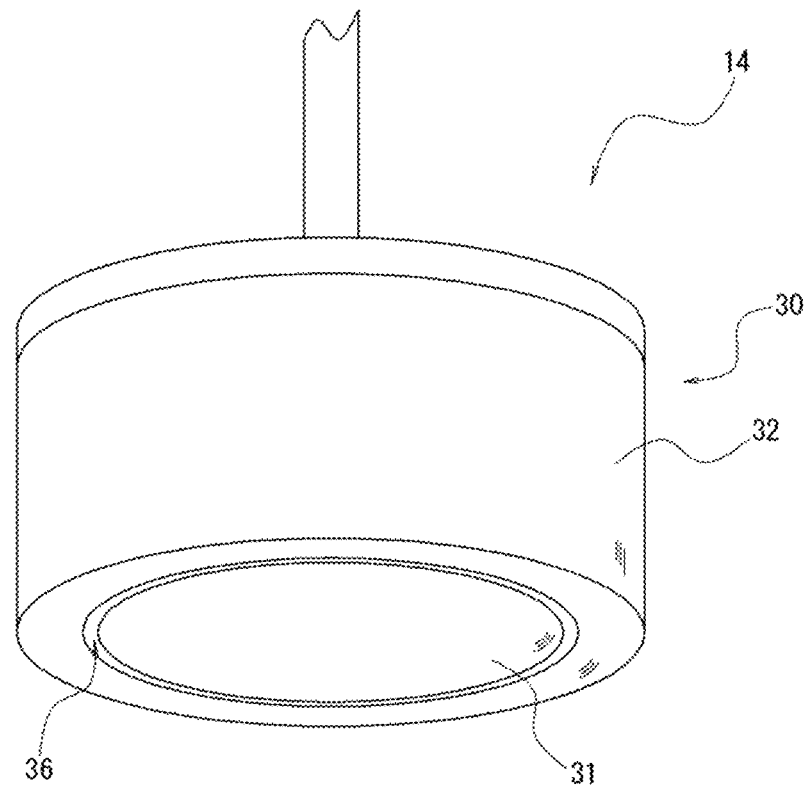
FIG. 4 is a perspective view illustrating an example of a plasma electrode of the processing head in the work processing apparatus illustrated in FIG. 1.
Figure 5:
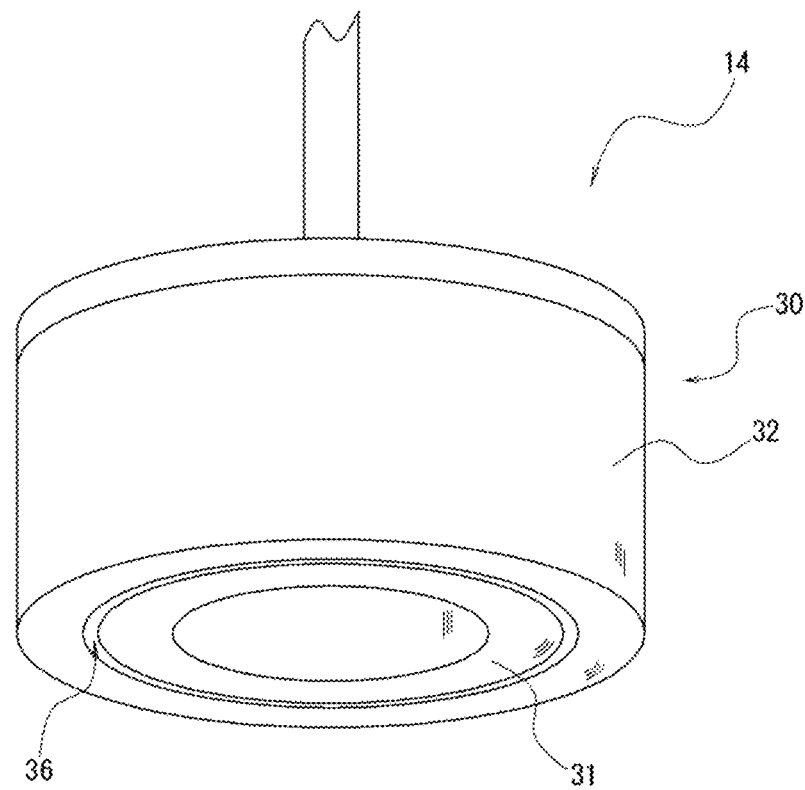
FIG. 5 is a perspective view illustrating another example of a plasma electrode of the processing head in the work processing apparatus illustrated in FIG. 1.

Here, in the plasma electrode 30 according to the present embodiment, as illustrated in FIG. 4 (a perspective view of the bottom surface side), a solid cylindrical central electrode 31, which is provided at the center in the radial direction, and an annular outer circumferential electrode 32, which is provided at the outer side in the radial direction with respect to the central electrode 31, are arranged with an annular slit portion 36 intermediating therebetween at a boundary position thereof. The slit portion 36 is configured as a plasma generation space (details thereof being described below). Moreover, as a modification example of the plasma electrode 30, as illustrated in FIG. 5 (a perspective view of the bottom surface side), a configuration in which the central electrode 31 is formed annular can be employed. Furthermore, while, as illustrated in FIG. 3, a processing pad 40 is provided at each of the respective bottom surfaces of the central electrode 31 and the outer circumferential electrode 32, with regard to FIG. 4 and FIG. 5 described above, the processing pad 40 is omitted from illustration for the sake of clarity about the illustrated structure.

Furthermore, plasma is able to be generated by, while supplying a base gas (noble gas such as helium (He)) and a reactive gas from respective reservoir portions (not illustrated) to the slit portion 36 through a pipe 46, applying a predetermined voltage to between adjacent electrodes configuring the slit portion 36. Specific examples of the reactive gas able to be favorably used include fluorine-based gas or oxygen gas in a case where a material to be processed is, for example, SiC, chlorine-based gas or oxygen gas in a case where a material to be processed is GaN, and fluorine-based gas, oxygen gas, or hydrogen gas in a case where a material to be processed is diamond.

The above-described configuration is able to turn (rotate) the turntable 12 so as to both rotate and revolve the holding plate 20 via the carrier 22. Simultaneously, the above-described configuration is able to turn (rotate) the processing head 14 and cause the processing head 14 to come into sliding contact with the work W held by the holding plate 20 while pressing the processing head 14 against the work W. At this time, the above-described configuration is able to cause the plasma electrode 30 being rotated to generate plasma and radiate the plasma to a surface to be processed of the work W. Accordingly, the above-described configuration is able to perform processing while performing reformulation or etching (both or one of them depending on a material of the work W or a type of the reactive gas) by radiation of plasma with respect to a surface to be processed of the work W, thus enabling improving a processing rate. As compared with an apparatus in which a plasma treatment process and a processing process are alternately performed by independently arranged mechanisms, such as that illustrated as an example in PTL 1, the present embodiment is able to perform these processes concurrently, i.e., without making a change of position of the work W, by successive processing, thus enabling performing processing in a short amount of time and enabling improving a production efficiency.

Figure 6:
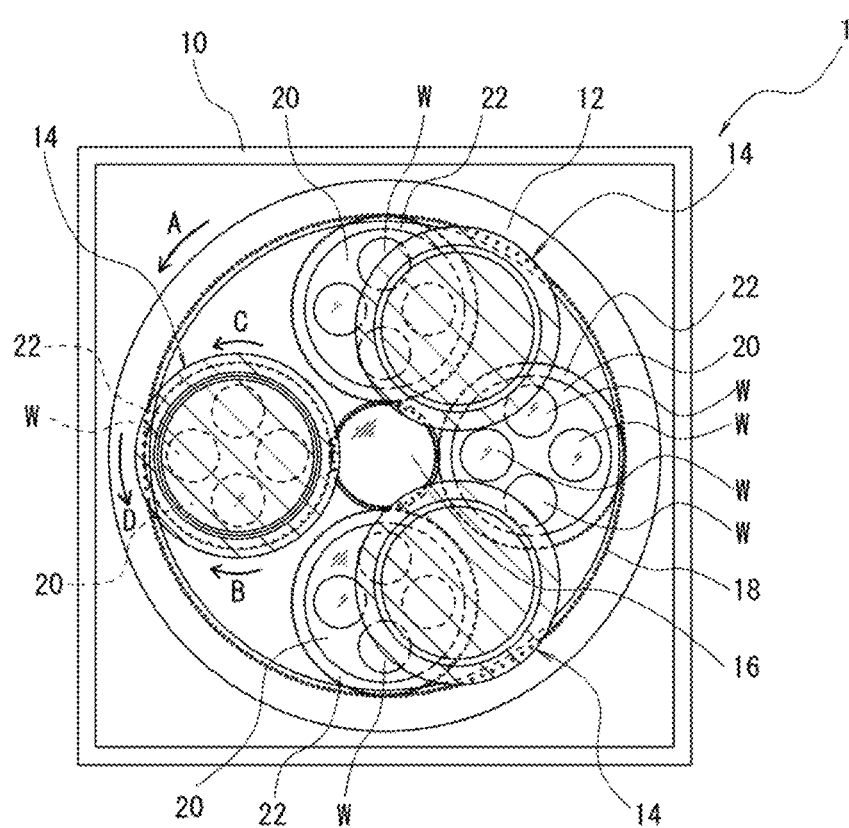
FIG. 6 is a sectional view illustrating another example of a processing head in the work processing apparatus illustrated in FIG. 1.

The work processing apparatus 1 according to the present embodiment is configured in such a manner that a plurality of (as an example, two) processing heads 14 are arranged with an outer diameter and arrangement allowing the slit portion 36 to pass therethrough and the processing pad 40 to come into sliding contact therewith with respect to all of the regions of surfaces to be processed of all of the works W, the respective positions of which are relatively changed by movement (rotation or revolution) of each mechanism. This enables improving a processing rate and enables performing processing in a short amount of time. However, the number of processing heads 14 to be arranged is not limited to the above-mentioned number, but a configuration in which three (alternatively, three or more) processing heads 14 are arranged as illustrated in FIG. 6 (a sectional view of a position corresponding to FIG. 2) can be employed, or a configuration in which one processing head 14 is arranged (not illustrated) can be employed.

Moreover, the work processing apparatus 1 according to the present embodiment is configured to include a slurry supplying device which supplies slurry (not illustrated). This configuration enables appropriately setting supplying (including non-supplying) of slurry in a processing process depending on a material of the work W or a processing condition.

Next, an example of the plasma electrode 30 provided in the processing head 14 is described in detail. The plasma electrode 30 according to the present embodiment is formed into a circular shape in bottom surface view and is configured to include the annular (hollow cylindrical) or said cylindrical central electrode 31 provided at the center in the radial direction and the annular (hollow cylindrical) outer circumferential electrode 32 provided at the outer side in the radial direction with respect to the central electrode 31. As mentioned above, the slit portion 36, which is a space portion provided at the boundary position between the central electrode 31 and the outer circumferential electrode 32, is configured as a plasma generation space. Accordingly, the plasma electrode 30 is configured in such a manner that the polarities of respective electrodes adjacent each other via the slit portion 36 are different from each other. As an example, as illustrated in the enlarged view (sectional view) of FIG. 3 and the perspective view of FIG. 4, the plasm electrode 30 is configured to include one outer circumferential electrode 32 with respect to the central electrode 31. Furthermore, the constituent materials of the central electrode 31 and the outer circumferential electrode 32 are not specifically limited, but the central electrode 31 and the outer circumferential electrode 32 are formed with an electrically conductive material.

Figure 7:
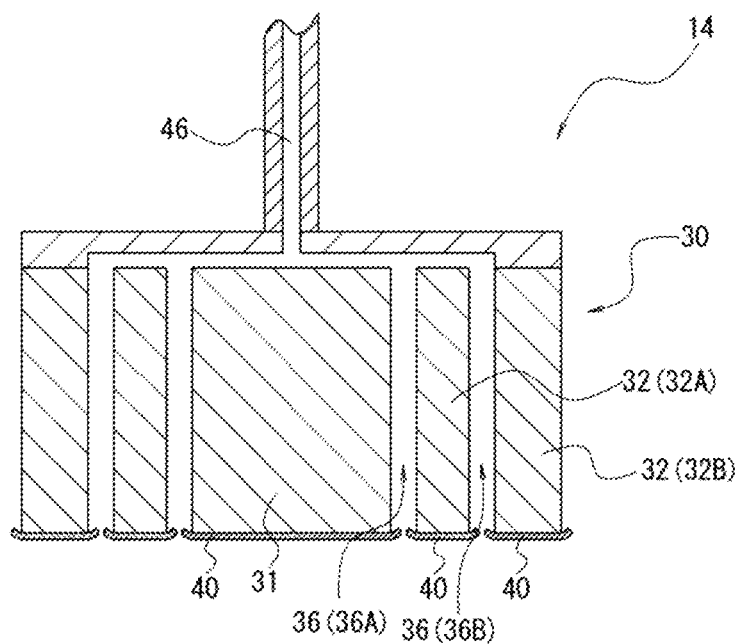
FIG. 7 is a sectional view illustrating another example of a plasma electrode of the processing head in the work processing apparatus illustrated in FIG. 1.

Moreover, as a modification example, as illustrated in FIG. 7 (a sectional view at a position corresponding to FIG. 3), the plasma electrode 30 can be configured to include a plurality of (although the number is not specifically limited, FIG. 7 illustrates an example in the case of two) outer circumferential electrodes 32 (32A and 32B in FIG. 7) with respect to the central electrode 31. In that case, the slit portion 36 is further provided at the boundary position between the outer circumferential electrodes 32 adjacent each other. This enables setting the number of slit portions 36 (36A and 36B in FIG. 7) large and, therefore, enables increasing the number of times of generation (the amount of radiation) of plasma per rotation of the processing head 14, enhancing a reformulation function or etching function on the surface to be processed of the work W, and further improving a processing rate and a production efficiency.

Furthermore, it is favorable that, irrespective of the number of outer circumferential electrodes 32, the processing pad 40 provided at the bottom surface thereof is configured to include an extension portion 40a which extends by a predetermined length toward the outer side (in a direction intersecting with the side surface) with respect to the outer circumferential surface (here, the side surface) of the plasma electrode 30 (more specifically, each of the central electrode 31 and the outer circumferential electrode 32) and slants upward, as illustrated in FIG. 3. According to this configuration, since, when the bottom surface of the processing head 14 being rotated comes into sliding contact with the work W while being pressed against the work W, an action for causing an edge of the work W to get into under the extension portion 40a is obtained, it is possible to prevent the processing pad 40 from coming into abutting contact with the edge of the work W and thus falling off from the plasma electrode 30.

Figure 8:
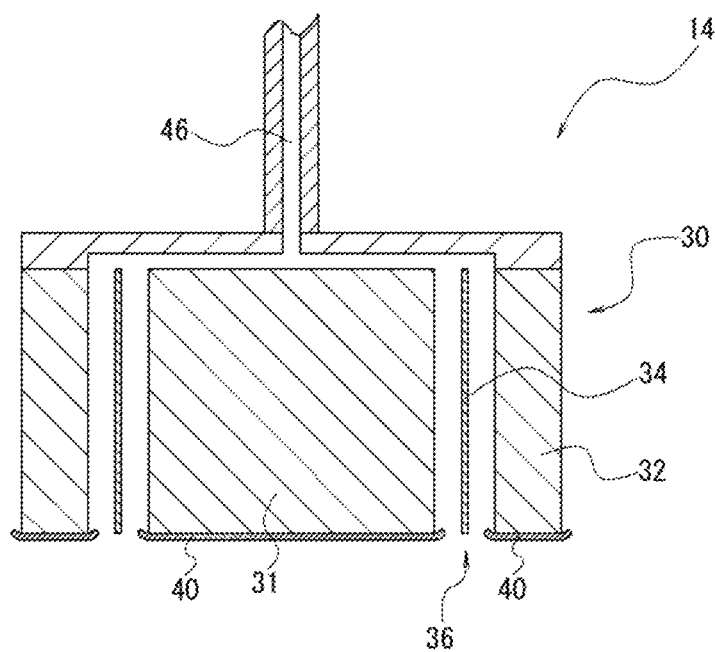
FIG. 8 is a sectional view illustrating another example of a plasma electrode of the processing head in the work processing apparatus illustrated in FIG. 1.

Next, another modification example of the plasma electrode 30 is described. Specifically, as illustrated in FIG. 8 (a sectional view at a position corresponding to FIG. 3), an additional electrode 34, which is annular (hollow cylindrical) and plate-like (or block-like) and is parallel to the electrode surface of the outer circumferential electrode 32, is provided at the slit portion 36. Thus, in planar view, the slit portion 36 is made into spaces divided in the radial direction by the additional electrode 34, so that each of the spaces is configured as a plasma generation space. Furthermore, the constituent material of the additional electrode 34 is not specifically limited, but the additional electrode 34 is formed with an electrically conductive material.

Such a configuration enables increasing the number of slit portions 36 to be arranged, i.e., a plasma generation space, in the processing head 14 without increasing the number of outer circumferential electrodes 32 to be arranged and, therefore, enables increasing the number of times of generation (the amount of radiation) of plasma per rotation of the processing head 14, enhancing a reformulation function or etching function on the surface to be processed of the work W, and further improving a processing rate and a production efficiency.

Figure 9:
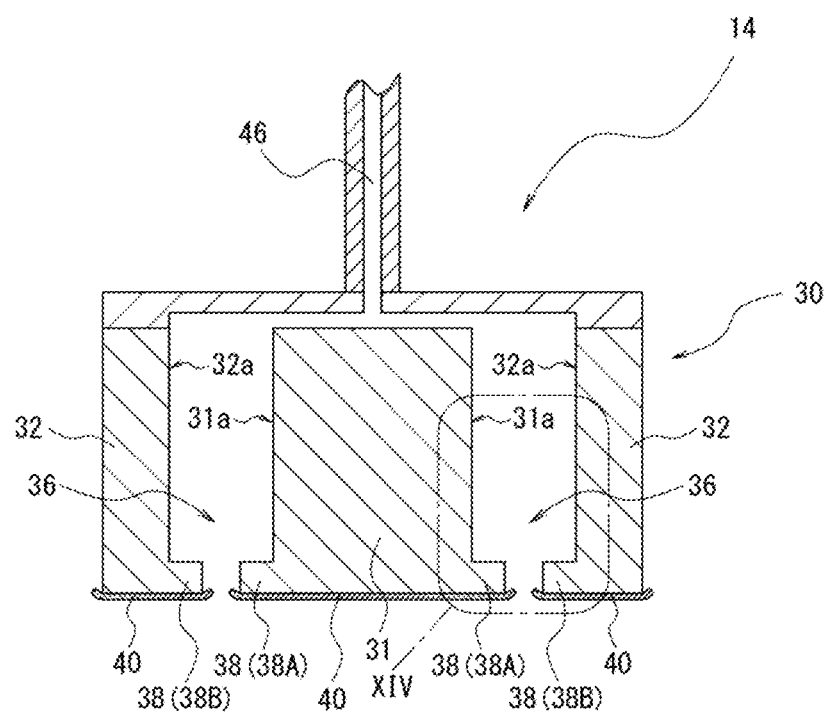
FIG. 9 is a sectional view illustrating another example of a plasma electrode of the processing head in the work processing apparatus illustrated in FIG. 1.

Moreover, yet another modification example of the plasma electrode 30 is described. Specifically, as illustrated in FIG. 9 (a sectional view at a position corresponding to FIG. 3), a projecting portion 38 which projects in a direction to reduce a separation dimension (a dimension in the radial direction) of the slit portion 36 is provided at a lower end position in at least one of two side surfaces 31a and 32a facing each other across the slit portion 36 (FIG. 9 illustrates a configuration example in a case where the projecting portion 38 is provided at each of the two surfaces). Furthermore, while FIG. 9 illustrates a configuration example in the case of the central electrode 31 and the outer circumferential electrode 32 facing each other, this also applies to a configuration example in the case of outer circumferential electrodes 32 facing each other when a plurality of outer circumferential electrodes 32 are provided.

Such a configuration enables generating plasma in a concentrative manner at the position of the projecting portion 38 in the plasma electrode 30, i.e., the lower end position closer to the work W. Accordingly, such a configuration enables increasing the amount of radiation of plasma acting on the work W and, therefore, enables enhancing a reformulation function or etching function on the surface to be processed of the work W and further improving a processing rate and a production efficiency.

Figure 14:
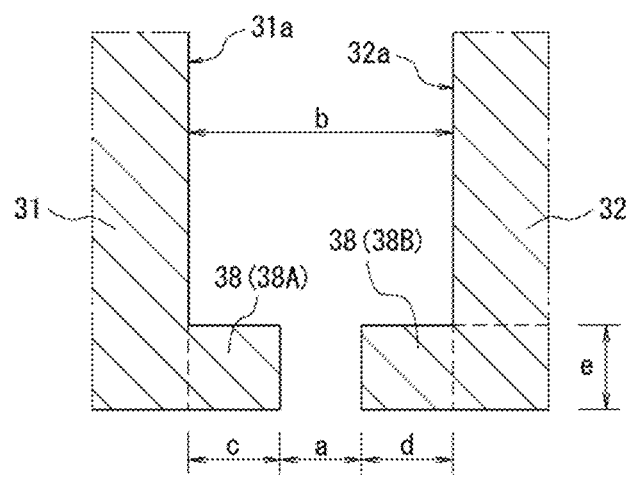
FIG. 14 is an enlarged view of a portion XIV in FIG. 9.
Figure 15A:
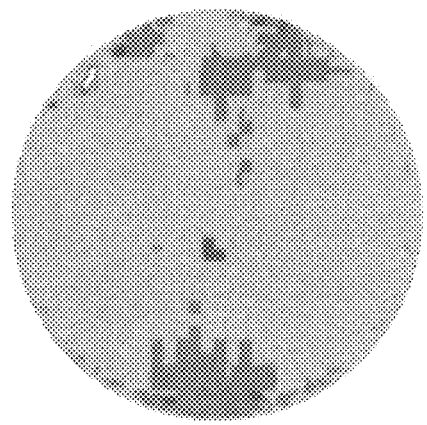
FIGS. 15A to 15E are diagrams obtained by visualizing intensities of generation of plasma in samples shown in Table 1.
Figure 15B:
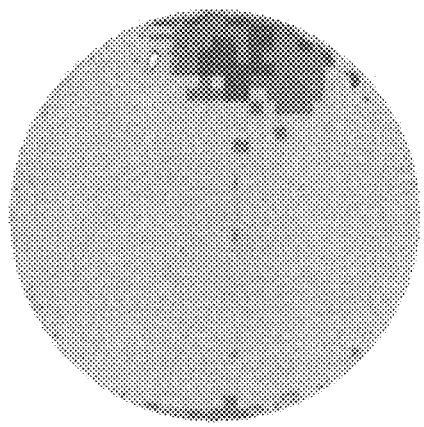
Figure 15C:
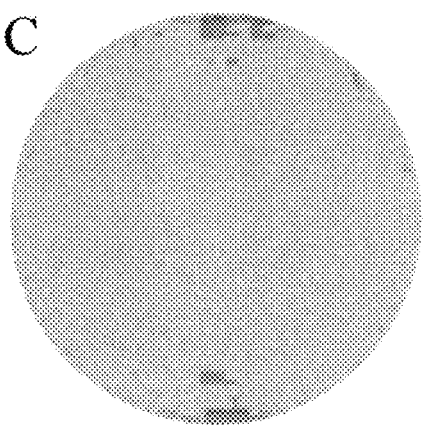
Figure 15D:
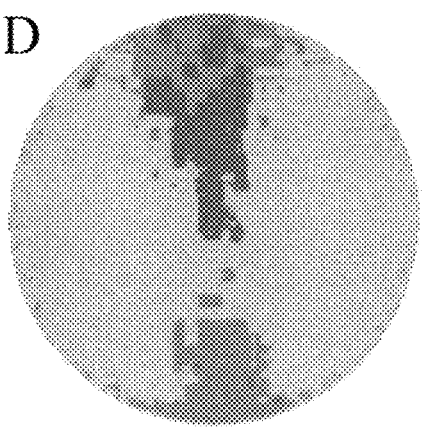
Figure 15E:
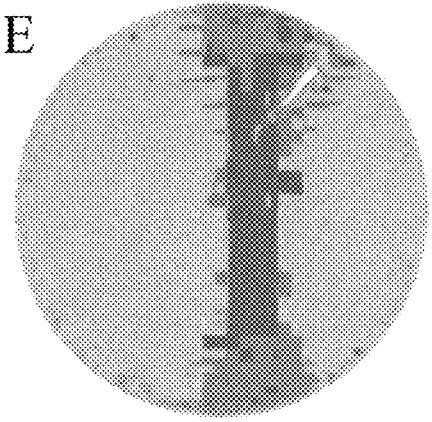

Here, the inventors of the present invention further conducted research about a configuration of the projecting portion 38 so as to enable generating plasma capable of more enhancing the above-mentioned advantageous effect. As an example, experimental results obtained by using samples (1) to (5) which differ in the configuration of the projecting portion 38 (see FIG. 14; however, the processing pad 40 is omitted from illustration for the sake of simplifying the figure) are shown in Table 1 and illustrated in FIGS. 15A, 15B, 15C, 15D, and 15E. Table 1 shows measurement results of electric power [watt (W)] required for stably generating plasma. On the other hand, FIGS. 15A to 15E are diagrams obtained by visualizing the intensities of generation of plasma measured at a position a predetermined distance (as an example, being set to 2 mm) away from the lower surface of the plasm electrode 30 with use of a Plasma Indicator manufactured by Sakura Color Products Corporation (a region which is dense in color represents a high (strong) intensity).

TABLE 1

| Configuration of Projecting Portion and Plasma Stable Generation Electric Power | | | | | |
|---|---|---|---|---|---|
| Dimension/ | Sample | | | | |
| Measured voltage | (1) | (2) | (3) | (4) | (5) |
| Dimension "a" in radial direction [mm] | 1 | 1 | 1 | 1 | 1 |
| Dimension "b" in radial direction [mm] | 1 | 3 | 4 | 5 | 6 |
| Dimension "c" in radial direction [mm] | 0 | 0 | 0 | 2 | 2 |
| Dimension "d" in radial direction [mm] | 0 | 2 | 3 | 2 | 3 |
| Dimension "e" in axial direction [mm] | 0 | 5 | 5 | 5 | 5 |
| Plasma stable generation electric power [W] | 40 | 20 | 20 | 23 | 20 |

As shown in Table 1, configurations including the projecting portion 38 (samples (2) to (5)) obtained results capable of more reducing electric power required for stably generating plasma, i.e., more attaining energy saving, than a configuration not including the projecting portion 38 (sample (1)).

Moreover, as illustrated in FIGS. 15A to 15E, configurations in which the projecting portion 38 is provided at both of two side surfaces 31a and 32a of the plasma electrode 30 with the same dimension in the radial direction (including approximately the same dimension) (samples (4) and (5)) obtained results capable of generating plasma with a higher (stronger) intensity, i.e., making the amount of radiation of plasma acting on the work W larger, than configurations in which the projecting portion 38 is provided at only one of the two side surfaces 31a and 32a (samples (2) and (3)). Additionally, it was confirmed that configuring an interval dimension "c" in the radial direction between the two side surfaces 31a and 32a to be five times or more an interval dimension "a" in the radial direction between two projecting portions 38A and 38B was favorable for surely attaining the above-mentioned advantageous effect.

Figure 16:
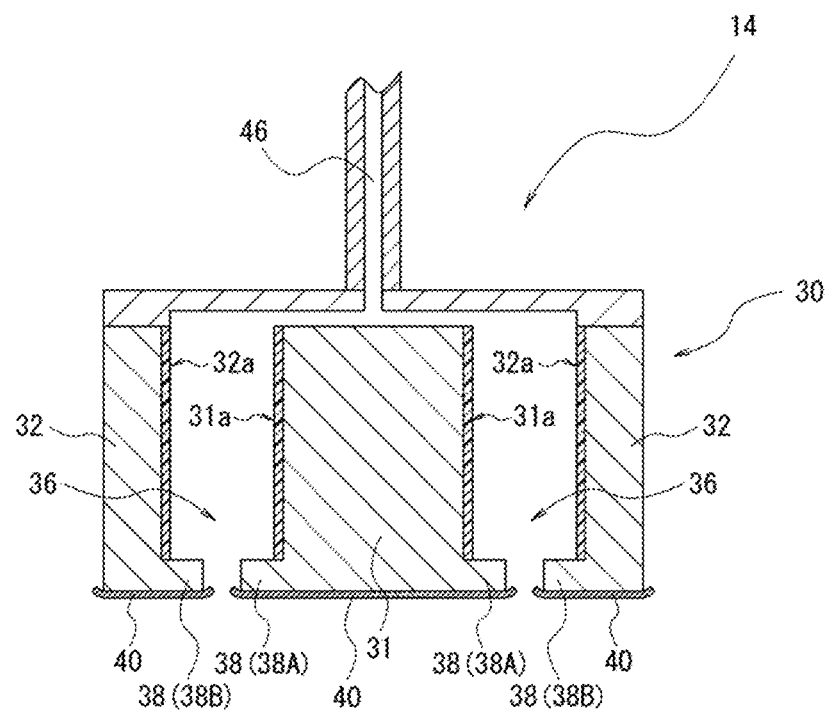
FIG. 16 is a sectional view illustrating another example of a plasma electrode of the processing head in the work processing apparatus illustrated in FIG. 1.

Additionally, yet another modification example of the plasma electrode 30 is described. Specifically, as illustrated in FIG. 16 (a sectional view at a position corresponding to FIG. 3), a configuration in which, with respect to two side surfaces 31a and 32a facing each other across the slit portion 36, regions not provided with the projecting portion 38 (in this case, regions parallel to the axial direction) are formed with an insulating material is employed. This configuration enables preventing or reducing electric discharge occurring onto the regions not provided with the projecting portion 38 and, therefore, enables generating plasma more in a concentrative manner between the two projecting portions 38A and 38B. Accordingly, this configuration enables increasing the amount of radiation of plasma acting on the work W.

Examples of the above-mentioned insulating material to be used include ceramics, heat-resistant glass, quartz, and resin. Here, in a case where the plasma radiation time is set to a relatively short time, examples of the resin to be favorably used include polyacetal resin (POM), polyvinyl chloride resin (PVC), super-high-molecular polyethylene resin, and phenolic resin. On the other hand, in a case where the plasma radiation time is set to a relatively long time, since heat resistance is required for the resin, examples of the resin to be favorably used include epoxy resin, polytetrafluoroethylene resin (PTFE), polyetheretherketone resin (PEEK), and polyphenylene sulfide resin (PPS). Furthermore, with regard to selection of materials and setting of thicknesses in the radial direction, for example, a dimensional stability and a chemical resistance relative to processing conditions are taken into account.

Second Embodiment

Figure 10:
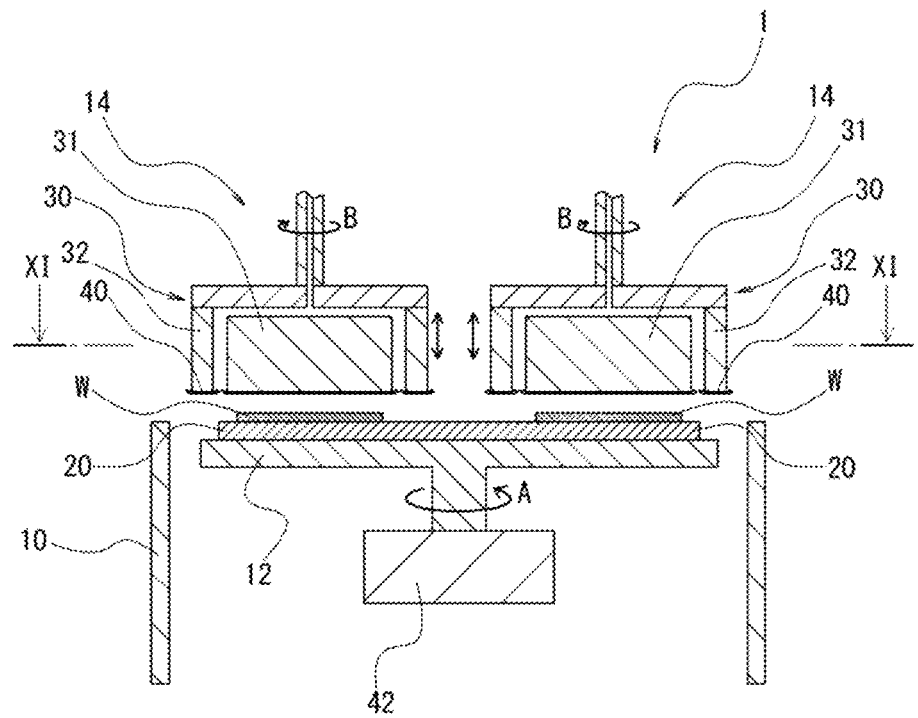
FIG. 10 is a front sectional view illustrating an example of a work processing apparatus according to a second embodiment of the present invention.
Figure 11:
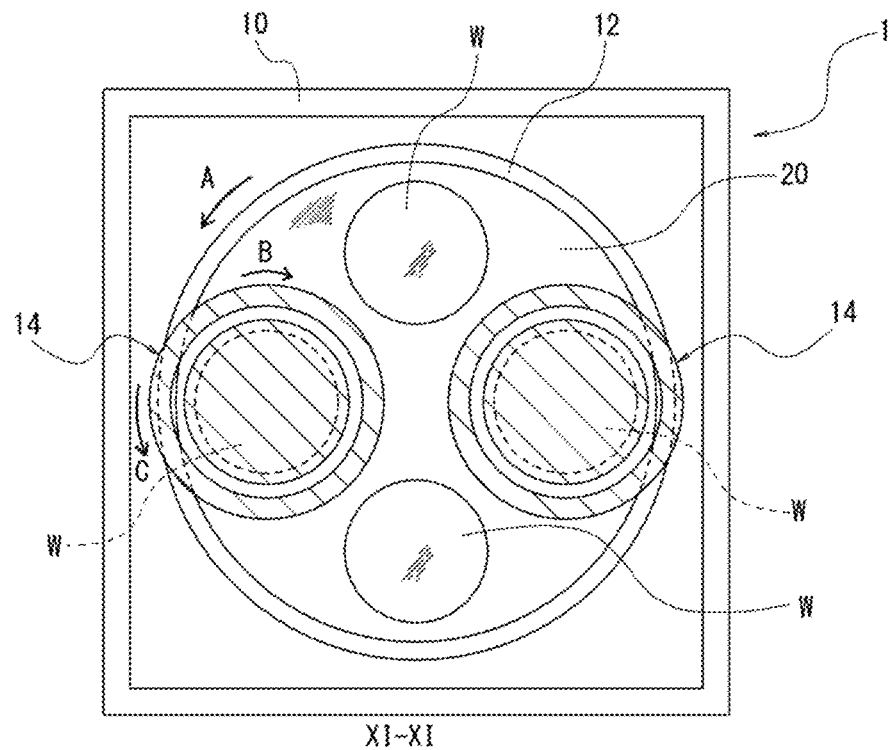
FIG. 11 is a sectional view taken along line XI-XI in FIG. 10.

Next, a work processing apparatus 1 according to a second embodiment of the present invention is described. Here, FIG. 10 is a front sectional view (schematic view) illustrating an example of the work processing apparatus 1 according to the present embodiment. Moreover, FIG. 11 is a sectional view (schematic view) taken along line XI-XI in FIG. 10.

The work processing apparatus 1 according to the present embodiment is similar in basic configuration to the above-described first embodiment but, particularly, has a difference in, for example, a mechanism which rotates the holding plate 20. In the following description, the present embodiment is described with a focus on the difference. Furthermore, the above-described modification examples illustrated in FIG. 7 to FIG. 9 can be similarly applied to the present embodiment.

Specifically, in the present embodiment, a configuration in which the holding plate 20 is held (fixed) onto the turntable 12, without via any carrier, with the axis of the holding plate 20 according with the central axis of the turntable 12 is employed. Thus, a configuration in which the turntable 12 being turned (rotated) (in the direction of arrow A) causes the holding plate 20 to turn (rotate) (in the direction of arrow C) is employed. Furthermore, the processing head 14 is configured to be turned (rotated) (in the direction of arrow B) as with the first embodiment.

As compared with the above-described first embodiment, since only one holding plate 20 is held on the turntable 12, although the number of works W which are able to be processed simultaneously decreases, it becomes possible to attain a significant reduction in size of the work processing apparatus 1.

On the other hand, with regard to the processing head 14, a configuration in which a plurality of (as an example, two) processing heads 14 are arranged is employed. However, the present embodiment is not limited to this configuration, and, as a modification example, a configuration in which three or more processing heads 14 are arranged (not illustrated) can be employed.

Figure 12:
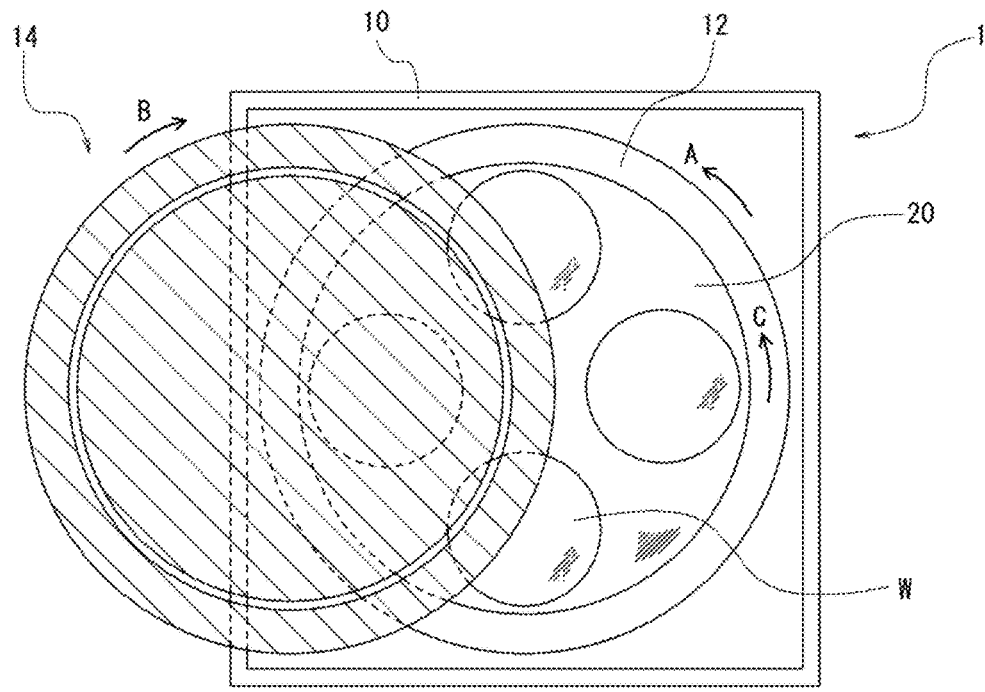
FIG. 12 is a sectional view illustrating another example of a processing head in the work processing apparatus illustrated in FIG. 10.
Figure 13:
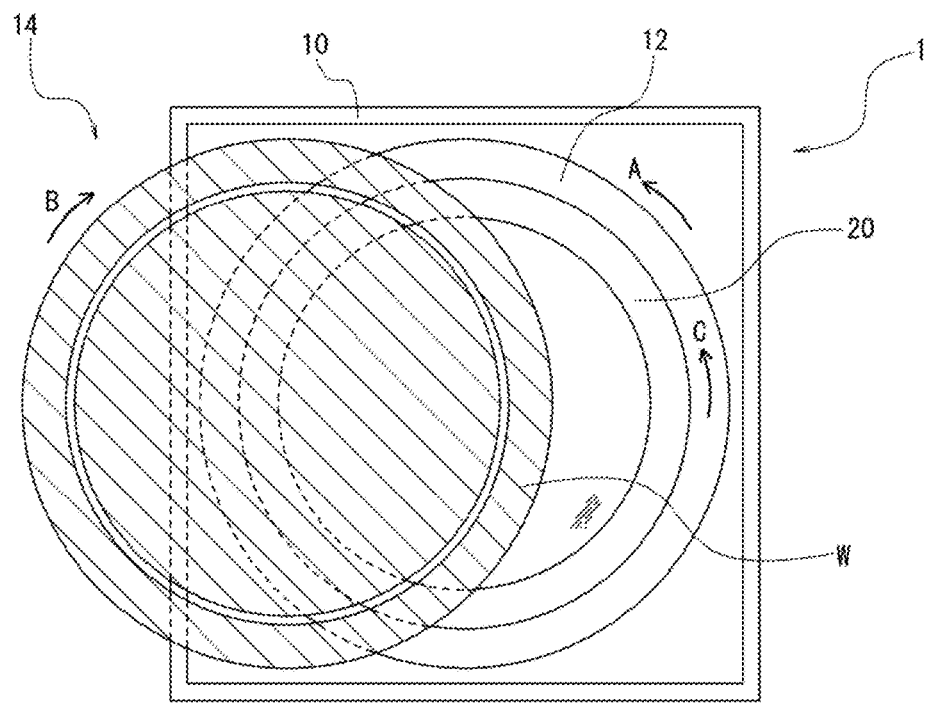
FIG. 13 is a sectional view illustrating another example of a processing head in the work processing apparatus illustrated in FIG. 10.

Additionally, as another modification example, a configuration in which, as illustrated in FIG. 12 and FIG. 13 (sectional views at a position corresponding to FIG. 11), a single processing head 14 is arranged with the axis thereof deviating from the central axis of the turntable 12 can be employed. FIG. 12 illustrates an example of a case where a plurality of works W the diameter of each of which is smaller than the radius of the holding plate 20 are held (pasted) on the holding surface (upper surface) of the holding plate 20 so as to be processed. On the other hand, FIG. 13 illustrates an example of a case where one work W the diameter of which is larger than the radius of the holding plate 20 is held (pasted) on the holding surface (upper surface) of the holding plate 20 so as to be processed. In either case, this configuration enables processing the whole surface of the work W with only one processing head 14. Accordingly, as compared with a case where a plurality of processing heads 14 are provided, since a simple apparatus configuration is employed, it becomes possible to reduce apparatus cost.

Furthermore, the other actions and advantageous effects are similar to those in the above-described first embodiment, and any repetitive description thereof is omitted.

As described above, according to aspects of the present invention, the work processing apparatus is able to perform processing while performing reformulation or etching of a surface to be processed even with respect to a work formed with use of a processing resistant material, thus enabling increasing a processing rate. Moreover, the work processing apparatus is able to perform a plasma treatment process and a processing process concurrently, i.e., without making a change of position of the work between mechanisms, by successive processing and, therefore, perform processing in a short amount of time, thus enabling improving a production efficiency.

Furthermore, the present invention is not limited to the above-described embodiments, and various other embodiments thereof are conceivable. Specifically, when a configuration in which, with regard to a rotational mechanism for a holding plate, turning is selected from any one of only rotation, only revolution, both rotation and revolution, and non-turning and a configuration in which, with regard to a rotational mechanism for a processing head, turning is selected from any one of only rotation, only revolution, both rotation and revolution, and non-turning are employed, configuration examples the number of which corresponds to the number of combinations of the configurations are conceivable (however, excluding a combination in which non-turning is selected with respect to the holding plate and non-turning is selected with respect to the processing head). Even these configuration examples enable obtaining advantageous effects similar to the above-described ones.

Incidentally, the above-described first embodiment corresponds to a case where the rotational mechanism for a holding plate has a configuration for performing both rotation and revolution and the rotational mechanism for a processing head has a configuration for performing rotation. Moreover, the above-described second embodiment corresponds to a case where the rotational mechanism for a holding plate has a configuration for performing rotation and the rotational mechanism for a processing head has a configuration for performing rotation. Particularly, in the case of these embodiments, an advantageous effect for improving a processing rate and a production efficiency becomes higher.

Furthermore, while a work to be processed has been described with a disk-shaped wafer taken as an example, the work is not limited to this, and the description can also be similarly applied to other types of plate-like (particularly, disk-like) work.

What is claimed is:

1. A work processing apparatus configured to perform processing of a surface to be processed of a work by causing a processing head to come into sliding contact with the work held on an upper surface of a holding plate, the work processing apparatus comprising:
   a processing head is provided to be rotatable and including a plasma electrode configured to generate plasma and radiate the plasma to the surface to be processed of the work,
   wherein, in the plasma electrode, an annular or solid cylindrical central electrode provided at a center in a radial direction and an annular outer circumferential electrode provided at an outer side in the radial direction with respect to the central electrode are arranged with an annular slit portion intermediating therebetween at a boundary position thereof, the slit portion is configured as a plasma generation space, and a processing pad is provided at bottom surfaces of the central electrode and the outer circumferential electrode;

wherein the plasma electrode includes a projecting portion which projects in a direction to reduce a separation dimension of the slit portion at a lower end position in at least one of two side surfaces facing each other across the slit portion;

wherein the projecting portion is formed into a shape projecting with a mutually identical dimension at a lower end position in each of the two side surfaces; and wherein regions not provided with the projecting portion in the side surfaces are formed with an insulating material.

2. The work processing apparatus according to claim 1, wherein the outer circumferential electrode includes a plurality of outer circumferential electrodes, and the slit portion is further provided at respective boundary positions between the plurality of outer circumferential electrodes.

3. The work processing apparatus according to claim 1, wherein an interval dimension in the radial direction of the two side surfaces is configured to be five or more times an interval dimension in the radial direction of the two projection portions.

4. The work processing apparatus according to claim 1, wherein the plasma electrode includes an annular additional electrode at the slit portion, and, in planar view, the slit portion is made into spaces divided by the additional electrode, so that each of the spaces is configured as a plasma generation space.

5. The work processing apparatus according to claim 1, wherein one or a plurality of processing heads are provided with an outer diameter and arrangement allowing a lower end position of the slit portion to face and the processing pad to come into sliding contact with all of regions of surfaces to be processed of all of the works, positions of the all of the regions relative to the processing head are changed by movement of the processing head and the holding plate.

6. The work processing apparatus according to claim 1, wherein the processing pad includes an extension portion which extends by a predetermined length toward an outer side with respect to a side surface of the plasma electrode and slants upward.

* * * * *